United States Patent
Kurokawa et al.

(10) Patent No.: US 8,487,281 B2
(45) Date of Patent: Jul. 16, 2013

(54) ELECTRON BEAM EXPOSURE APPARATUS AND ELECTRON BEAM EXPOSURE METHOD

(75) Inventors: Masaki Kurokawa, Tokyo (JP); Akio Yamada, Tokyo (JP); Tatsuro Okawa, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 13/439,595

(22) Filed: Apr. 4, 2012

(65) Prior Publication Data

US 2012/0256106 A1    Oct. 11, 2012

(30) Foreign Application Priority Data

Apr. 6, 2011    (JP) .................... 2011-084406

(51) Int. Cl.
 *A61N 5/00*    (2006.01)
(52) U.S. Cl.
 USPC .............. 250/492.3; 250/492.22; 250/396 R; 250/492.23; 250/492.1; 250/491.1
(58) Field of Classification Search
 USPC ............... 250/492.3, 492.22, 396 R, 492.23, 250/492.1, 491.1
 See application file for complete search history.

(56) References Cited

U.S. PATENT DOCUMENTS

2006/0214117 A1*    9/2006    Yamada ................. 250/492.1

FOREIGN PATENT DOCUMENTS

JP    2006-278492    10/2006

* cited by examiner

*Primary Examiner* — Nikita Wells
*Assistant Examiner* — Meenakshi Sahu
(74) *Attorney, Agent, or Firm* — Muramatsu & Associates

(57) ABSTRACT

In a multi-column electron beam exposure apparatus for performing exposure treatment in parallel by arranging a plurality of column cells on a wafer, a relationship between exposure intensity and a line width for each column cell is obtained (Steps S41 and S44). Then, correction parameters are obtained, which allow a relationship between exposure intensity and a line width for a correction target column cell to coincide with a relationship between exposure intensity and a line width for a reference column cell selected from among the plurality of column cells (Steps S43 and S46). Thereafter, exposure time of each column cell is obtained by correcting the exposure time of the reference column cell based on the correction parameters thus obtained.

14 Claims, 8 Drawing Sheets

|  | position x | position y | size X | size Y | proximity effect correction coefficient P |
|---|---|---|---|---|---|
| shot 1 | 110 | 0 | 1 | 1 | 0.8 |
| shot 2 | 210 | 20 | 5 | 5 | 1.1 |
| ⋮ | ⋮ | ⋮ | ⋮ | ⋮ | ⋮ |

ELECTRON BEAM EXPOSURE APPARATUS AND ELECTRON BEAM EXPOSURE METHOD

CROSS-REFERENCE TO RELATED APPLICATIONS

This application is based upon and claims and the benefit of priority of the prior Japanese Patent Application No.2011-084406, filed Apr. 6, 2011, the entire contents of which are incorporated herein by reference.

FIELD

The embodiments discussed herein are related to a multi-column electron beam exposure apparatus and a multi-column electron beam exposure method for performing exposure treatment with a plurality of column cells in parallel.

BACKGROUND

Along with the recent miniaturization of semiconductor devices, a micropattern has been drawn on a photomask by exposure using an electron beam exposure apparatus.

As one of such electron beam exposure apparatuses, a multi-column electron beam exposure apparatus has been proposed, in which a plurality of column cells for irradiating electron beams are arranged.

The multi-column electron beam exposure apparatus has a processing speed faster than a single-column electron beam exposure apparatus, since the multi-column electron beam exposure apparatus performs exposure with the plurality of column cells in parallel.

However, in the multi-column electron beam exposure apparatus, restrictions on mechanical working accuracy, and the like cause aberration of an electron optical system, effective current density of the electron beam, an aperture size of an exposure mask (rectangular aperture), and the like to vary among the column cells. For this reason, even when the same pattern is exposed for the same exposure time, the finished line width varies among the column cells.

To counter such a situation, it is conceivable to measure the finished line width of each column cell and to correct the exposure time of each column cell so as to achieve a uniform line width.

However, the exposure using the electron beam involves a so-called proximity effect in which a line width of a pattern varies due to a change in backscattering amount of the electron beam according to the pattern density. For this reason, in the electron beam exposure apparatus, the exposure time is changed according to the pattern density to correct the proximity effect.

However, the variation in line width among the column cells cannot be prevented, when the exposure time is changed for proximity effect correction and the like, just by matching the exposure time of each column cell with a specific finished line width as described above.

Moreover, as another correction method, it is conceivable to correct a variation in line width among the column cells by utilizing proximity effect correction calculation. In this case, a forward scattering length, a backscattering length and scattering intensity specific to each column cell are experimentally set so as to achieve a uniform line width among the column cells. Thereafter, the exposure time of each column cell is calculated by performing proximity effect correction calculation based on such parameters.

However, the proximity effect correction calculation performed under specific conditions for each column cell increases the complexity, which results in an increase in the time to generate the exposure data. Moreover, a large number of pieces of exposure data specific to each column cell needs to be managed, which is not practical.

The three parameters for the proximity effect correction calculation cannot achieve enough degree of freedom to correct the causes of the variation in line width, such as the proximity effect, the aberration of the electron optical system, the effective current density of the electron beam and the aperture size of the exposure mask. For this reason, accurate correction cannot be performed.

SUMMARY

Therefore, it is an object of the present invention to provide a multi-column electron beam exposure apparatus and a multi-column electron beam exposure method capable of correcting a variation in line width among column cells even when proximity effect correction is performed.

The foregoing problems are solved by an electron beam exposure apparatus including: a plurality of column cells arranged above a sample and configured to irradiate electron beams in parallel onto a surface of the sample; an integrated controller configured to generate exposure data including an exposure position, an exposure pattern and an exposure time of each shot of the plurality of column cells; a column cell control unit provided in each of the column cells and configured to control the column cell based on the exposure data; a correction parameter storage unit provided in the integrated controller and configured to store a correction parameter for allowing a relationship between exposure intensity and a line width for a correction target column cell to coincide with a relationship between exposure intensity and a line width for a reference column cell selected from among the plurality of column cells; a reference exposure time storage unit provided in the integrated controller and configured to store reference exposure time required to form a predetermined reference pattern having a line width as designed in the reference column cell; and an exposure time calculating unit provided in the integrated controller and configured to obtain exposure time of the correction target column cell by correcting the reference exposure time based on the correction parameter.

In the electron beam exposure apparatus described above, the correction parameter may include a first correction parameter for correcting a slope of the relationship between the exposure intensity and the line width for the correction target column cell, and a second correction parameter for correcting the intercept of the relationship between the exposure intensity and the line width for the correction target column cell. Moreover, the exposure time calculating unit may obtain the exposure time of the correction target column cell by adding the second correction parameter to a value obtained by multiplying the reference exposure time by the first correction parameter.

Furthermore, the foregoing problems are solved by an electron beam exposure method for exposing a plurality of patterns in parallel on a wafer by use of a plurality of column cells configured to irradiate electron beams, the method including the steps of: obtaining a relationship between exposure intensity and a line width for each of the column cells by exposing a predetermined pattern in the column cell while changing exposure time and measuring the line width of the pattern; obtaining a correction parameter for allowing a relationship between exposure intensity and a line width for a correction target column cell to coincide with a relationship between a line width and exposure intensity for a reference column cell selected from among the plurality of column cells; obtaining reference exposure time required to form a predetermined reference pattern having a line width as designed in the reference column cell; calculating exposure time of the correction target column cell based on the correction parameter and the reference exposure time; and performing exposure in the correction target column cell for the exposure time of the correction target column cell.

In the electron beam exposure apparatus described above, the exposure time of each column cell is obtained by correcting the exposure time of the reference column cell based on the correction parameters for allowing the relationship between exposure intensity and a line width for the correction target column cell to coincide with the relationship between the exposure intensity and the line width for the reference column cell. Accordingly, the variation in line width among the column cells can be corrected, even when the exposure intensity (exposure time) is changed for proximity effect correction and the like.

DESCRIPTION OF EMBODIMENTS

Embodiments are described below with reference to the accompanying drawings.

Figure 1:
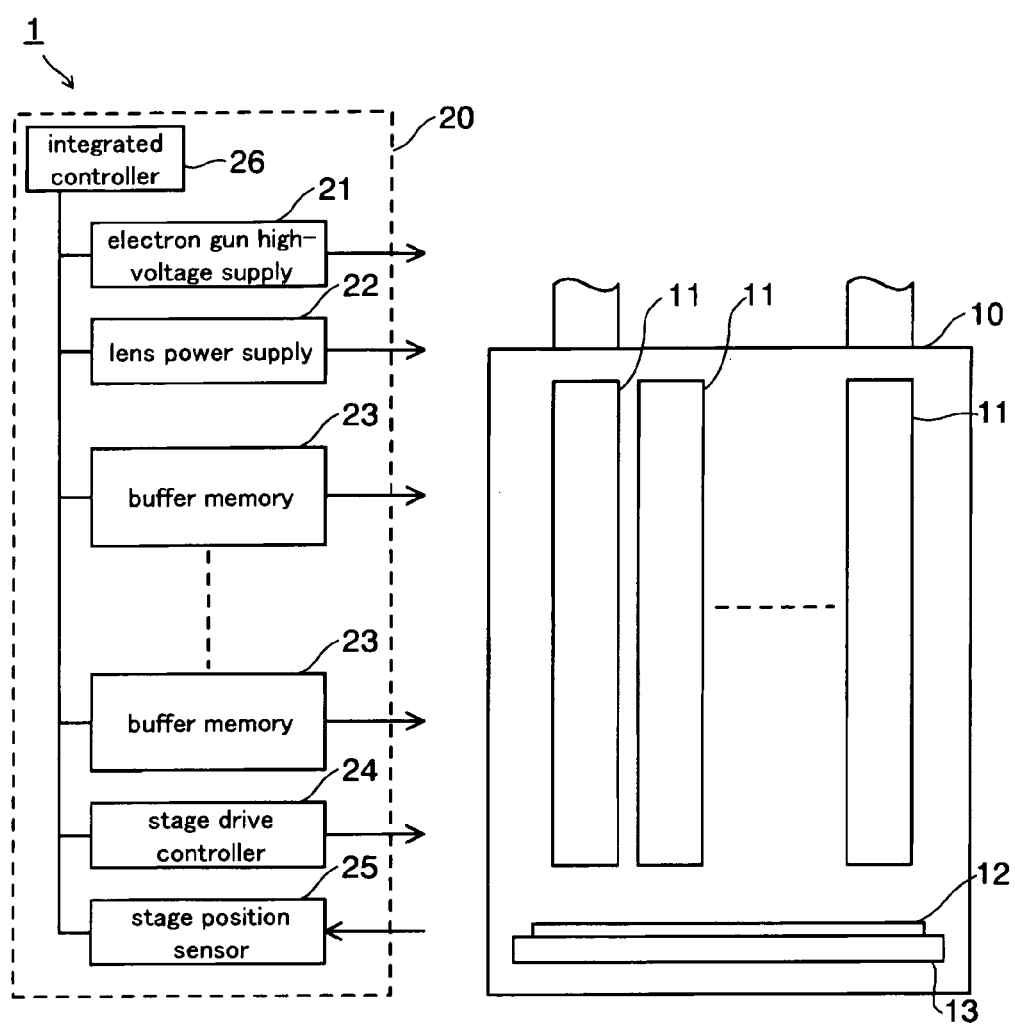
FIG. 1 is a block diagram of an electron beam exposure apparatus according to an embodiment.

FIG. 1 is a block diagram of an electron beam exposure apparatus according to an embodiment.

As shown in FIG. 1, an electron beam exposure apparatus 1 includes an electron beam column 10 including a plurality of column cells 11, and a controller 20 configured to control the electron beam column 10. The controller 20 includes an electron gun high-voltage power supply 21, a lens power supply 22, buffer memories 23, a stage drive controller 24, and a stage position sensor 25.

The electron gun high-voltage power supply 21 generates a high voltage for driving an electron gun in each of the column cells 11 in the electron beam column 10. The lens power supply 22 supplies a drive current to an electromagnetic lens in each of the column cells 11 in the electron beam column 10. The buffer memories 23 are provided so as to correspond to the number of the column cells 11. The buffer memories 23 store exposure data sent from an integrated control system 26, sequentially read exposure conditions of each shot included in the exposure data, and then transfer the read exposure conditions to the column cells 11. The stage drive controller 24 moves the position of a wafer 12 based on positional information from the stage position sensor 25.

The respective units 21 to 24 of the controller 20 described above are controlled by the integrated control system 26 including a work station and the like.

The electron beam column 10 includes a plurality of, e.g., four identical column cells 11. Under the column cells 11, a wafer stage 13 having the wafer 12 mounted thereon is disposed.

Figure 2:
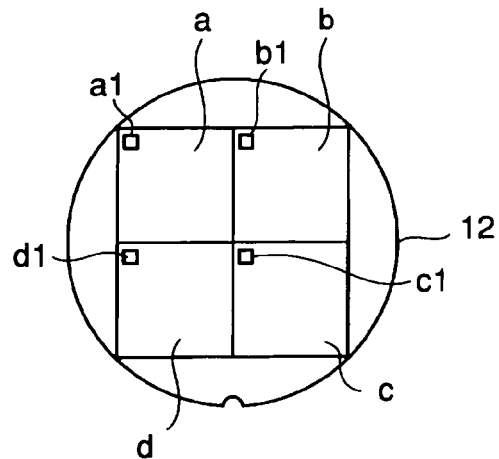
FIG. 2 is a plan view showing an example of a region where lithography is performed in each of column cells on a wafer.

FIG. 2 is a plan view showing an example of regions for lithography performed by each column on the wafer. Note that FIG. 2 shows the case where the electron beam column 10 includes four column cells 11.

As shown in FIG. 2, in one shot (exposure step), each column cell 11 performs exposure by simultaneously irradiating electron beams onto different regions a1, b1, c1 and d1 on the wafer 12. Each column cell 11 repeats such a shot while changing the electron beam irradiation position and the wafer position, thus performing the exposure of the regions a to d on the wafer 12.

Figure 3:
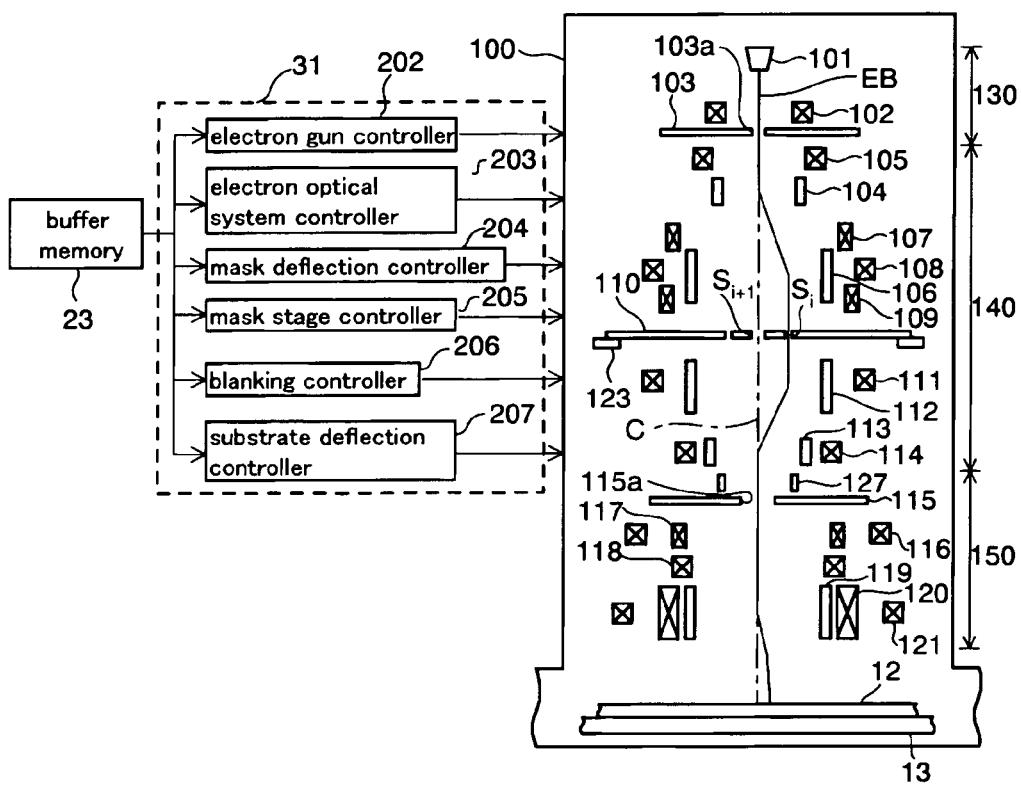
FIG. 3 is a block diagram of the column cell in the electron beam exposure apparatus shown in FIG. 1.

FIG. 3 is a block diagram of the column cell 11 in the electron beam exposure apparatus 1 shown in FIG. 1.

As shown in FIG. 3, the column cell 11 is divided into two main units: an exposure unit 100 and a column cell control unit 31 configured to control the exposure unit 100. The exposure unit 100 includes an electron beam generation unit 130, a mask deflection unit 140, and a substrate deflection unit 150.

In the electron beam generation unit 130, an electron gun 101 generates an electron beam EB, and the electron beam EB is converged by a first electron lens 102, thus obtaining the electron beam EB having a predetermined current density. Furthermore, the converged electron beam EB is shaped to have a rectangular cross section by passing through a rectangular aperture 103a of a beam shaping mask 103.

Thus, the electron beam EB generated by the electron beam generation unit 130 is focused onto an exposure mask 110 by a second electron lens 105 in the mask deflection unit 140. Then, the electron beam EB is deflected into a specific pattern $S_i$ formed on the exposure mask 110 by use of a first electrostatic deflector 104 and a second electrostatic deflector 106, whereby a cross-sectional shape thereof is formed into the shape of the pattern $S_i$ by passing through the exposure mask 110.

Note that the exposure mask 110 is fixed on a mask stage 123. The mask stage 123 is movable on a horizontal plane. When using a pattern $S_i$ located outside the deflection range (beam deflection range) of the first electrostatic deflector 104 and the second electrostatic deflector 106, the pattern $S_i$ is moved into the beam deflection range by moving the mask stage 123.

A third electromagnetic lens 108 and a fourth electromagnetic lens 111 arranged above and below the exposure mask 110 focus the electron beam EB on the wafer 12.

The electron beam EB passed through the exposure mask 110 is deflected back to an optical axis C by a third electrostatic deflector 112 and a fourth electrostatic deflector 113.

Then, the size of the electron beam EB is reduced by a fifth electromagnetic lens 114.

The deflection aberration of the electron beam EB caused by the electrostatic deflectors 104, 106, 112 and 113 in the mask deflection unit 140 is corrected by a first correction coil 107 and a second correction coil 109.

Thereafter, the electron beam EB is passed through an aperture 115a of a shielding plate 115 provided in the substrate deflector 150, and is deflected to a predetermined position on the wafer 12 by a fifth electrostatic deflector 119 and an electromagnetic deflector 120. Then, the electron beam EB is projected onto the surface of the wafer 12 through a first projection electromagnetic lens 116 and a second projection electromagnetic lens 121.

Note that the deflection aberration of the electron beam EB caused by the deflectors 119 and 120 in the substrate deflector 150 is corrected by a third correction coil 117 and a fourth correction coil 118.

By use of the electron optical system described above, an image of the pattern $S_i$ on the exposure mask 110 is transferred to the wafer 12 at a given reduction ratio, e.g., 1/20.

Meanwhile, the column cell control unit 31 includes an electron gun controller 202, an electron optical system controller 203, a mask deflection controller 204, a mask stage controller 205, a blanking controller 206, and a substrate deflection controller 207. Among these controllers, the electron gun controller 202 controls an acceleration voltage of the electron beam EB, beam emission conditions, or the like by controlling the electron gun 101. Moreover, the electron optical system controller 203 controls the amount of current supplied to the electromagnetic lenses 102, 105, 108, 111, 114, 116, and 121, and thereby adjusting a magnification and a focal position of the electron optical system.

The blanking controller 206 controls a voltage applied to a blanking electrode 127 and irradiates the electron beam EB onto the surface of the wafer 12 by passing the electron beam EB through the aperture 115a of the shielding plate 115 only for a predetermined exposure time. The substrate deflection controller 207 deflects the electron beam EB to the given position on the wafer 12 by controlling a voltage applied to the fifth electrostatic deflector 119 and an amount of current supplied to the electromagnetic deflector 120.

The controllers 202 to 207 in the column cell control unit 31 are operated based on the exposure data sent from the integrated control system 26 through the buffer memory 23.

There are differences in aberration of the electron optical system, effective current density, pattern size of the exposure mask, and the like among the column cells 11 in the electron beam exposure apparatus 1 described above. Even if exposure is performed for the same pattern for the same exposure time, the finished line widths of the patterns formed in the respective column cells 11 vary among the column cells.

To avoid this, in the electron beam exposure apparatus 1 according to the embodiment, the integrated control system 26 corrects a line width error among the column cells 11 by performing correction calculation of the exposure time for the column cells 11.

Figure 4:
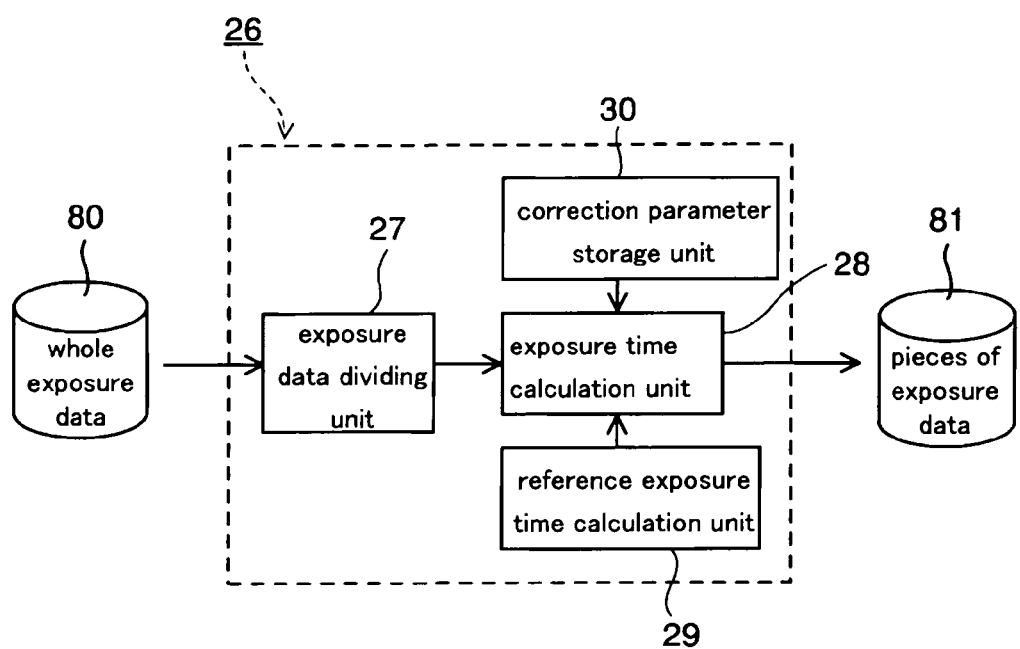
FIG. 4 is a block diagram of an integrated control system in the electron beam exposure apparatus shown in FIG. 1.

FIG. 4 is a block diagram of the integrated control system 26 shown in FIG. 1.

As shown in FIG. 4, the integrated control system 26 includes an exposure data dividing unit 27, an exposure time calculating unit 28, a reference exposure time calculating unit 29, and a correction parameter storage unit 30. Among them, the exposure data dividing unit 27 divides the whole exposure data 80 inputted to the electron beam exposure apparatus 1 into pieces of exposure data 81 for the respective column cells 11.

The reference exposure time storage unit 29 stores exposure time (hereinafter referred to as the reference exposure time $T_0$) which allows the finished line width of the exposed pattern to be equal to a designed value or a line width of an incident electron beam in a reference column cell selected from among the column cells 11. Moreover, the correction parameter storage unit 30 stores correction parameters for allowing a relationship between an exposure intensity and a line width of another column cell to coincide with a relationship between an exposure intensity and a line width of the reference column cell.

The exposure time calculating unit 28 generates the exposure data 81 of each column cell 11 by calculating the exposure time of the reference column cell and other column cells based on the reference exposure time $T_0$, a proximity effect correction coefficient P included in the exposure data, and the correction parameters.

A method for generating the expoure data 81 for each column cell 11 by the integrated control system 26 is described below. Here, FIG. 5 is a flowchart showing the method for generating the exposure data 81 for each column cell 11 by the integrated control system 26.

Figures 5, 6:
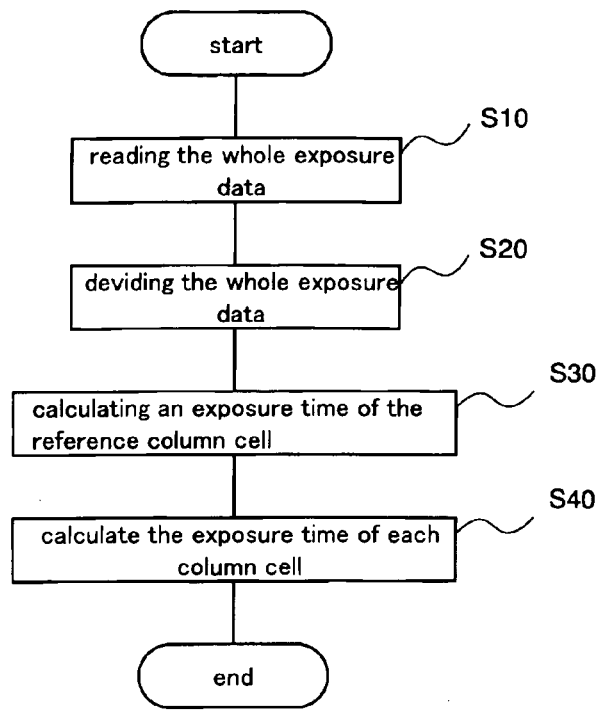
FIG. 5 is a flowchart showing a method for generating exposure data for each column cell by the integrated control system shown in FIG. 4.
FIG. 6 is a table showing an example of the whole exposure data.

First, in Step S10 in FIG. 5, the integrated control system 26 reads the whole exposure data 80. Here, FIG. 6 is a table showing an example of the whole exposure data 80 in the case of a variable rectangular beam. As shown in FIG. 6, the whole exposure data 80 includes exposure position coordinates (x, y) of each shot, a beam size (X, Y), and the proximity effect correction coefficient P. Among them, the exposure position coordinates (x, y) specify an irradiation position of the electron beam EB on the wafer 12 with a coordinate system on the wafer 12. The beam size specifies the beam size in X and Y directions when the variable rectangular beam is used. Note that when exposure is performed using a partial one-shot exposure method, data specifying a pattern on an exposure mask may be used instead of the beam size.

The proximity effect correction coefficient P represents the ratio between the exposure intensity required to obtain a line width as designed in an exposure target pattern and the exposure intensity required to obtain a line width as designed in a reference pattern.

The proximity effect correction coefficient P is further described below.

In the proximity effect correction, the following exposure intensity distribution (EID) function represents the spread of the infinitely small electron beam EB by forward and back scattering when the electron beam is irradiated onto a resist.

[Equation 1]

$$EID(x, y) = \frac{1}{1+\eta}\left\{\frac{1}{\pi a^2}\exp\left(\frac{-(x^2+y^2)}{a^2}\right) + \frac{\eta}{\pi\beta^2}\exp\left(\frac{-(x^2+y^2)}{\beta^2}\right)\right\} \quad (1)$$

In the first term in the above equation (1), the forward scattering of the electron beam is approximated with a Gaussian distribution. Meanwhile, in the second term, the backscattering of the electron beam is approximated with a Gaussian distribution. Note that, in the equation (1), $\eta$ is electron beam scattering intensity determined by a resist material, a base material and the like, $\alpha$ is a forward scattering length, and $\beta$ is a backscattering length. $\beta$ varies with an accelerating voltage of the electron beam EB or the like. For example, when the accelerating voltage is 50 kev, β is about 6 μm.

An accumulated energy distribution of the resist is obtained by convolving the energy distribution of the electron beam EB to be irradiated with the EID function described above. For example, the following equation represents an accumulated energy distribution E (x, y) when a rectangular electron beam EB is irradiated, which has an energy density E, an x-direction size $\Delta x = x1-x2$ and a y-direction size $\Delta y = y1-y2$.

[Equation 2]

$$E(x, y) = \int_{x1}^{x2} \int_{y1}^{y2} E \cdot EID(x - x', y - y') dx' dy' \quad (2)$$

As for the exposure intensity in the center of the accumulated energy distribution E (x, y), assuming that a contributory portion of the first term of the EID function is $2\epsilon$ and a contributory portion of the second term is $\alpha\eta$, $\epsilon$ is approximated by the area, width and shape of the pattern to be exposed. Moreover, $\alpha$ can be approximated by a weighted pattern density within about three times the backscattering length β.

Figure 7:
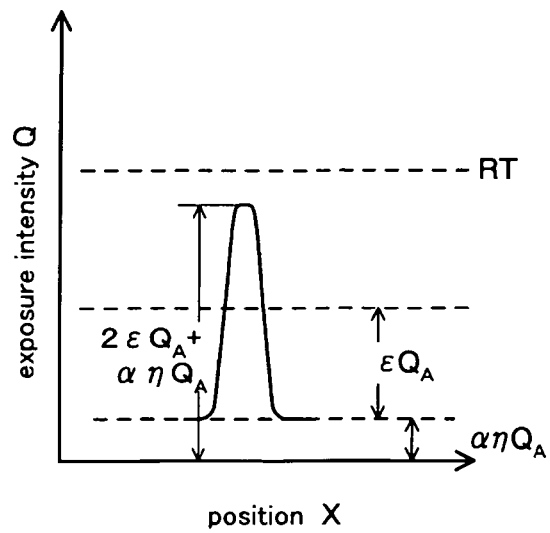
FIG. 7 is a graph showing an example of an exposure intensity distribution of an exposure target pattern.

FIG. 7 is a graph showing an example of an exposure intensity distribution Q (x) of the exposure target pattern, which is obtained by substituting the energy density E in the equation (2) with current density J of the electron beam EB to be irradiated. Note that $Q_A$ in FIG. 7 represents a set value of exposure intensity obtained by multiplying the current density J of the electron beam EB by the exposure time t of the electron beam EB.

As shown in FIG. 7, the maximum value of the exposure intensity distribution Q of the exposure target pattern is expressed by the sum of the contributory portion $2\epsilon Q_A$ of the first term of the EID function and the contributory portion $\alpha\eta Q_A$ of the second term of the EID function. In this exposure target pattern, when the exposure intensity $Q_A$ is set so that the sum of $\epsilon Q_A$ and $\alpha\eta Q_A$ coincides with the minimum resolution exposure intensity RT of the resist, the line width of the exposure target pattern is equal to the line width as designed. The exposure intensity $Q_A$ which satisfies $RT = \epsilon Q_A + \alpha\eta Q_A$ is the exposure intensity required to obtain the line width as designed in the exposure target pattern. Note that, in the example shown in FIG. 7, $Q_A$ needs to be increased since the sum of $\epsilon Q_A$ and $\alpha\eta Q_A$ is smaller than RT.

Figure 8:
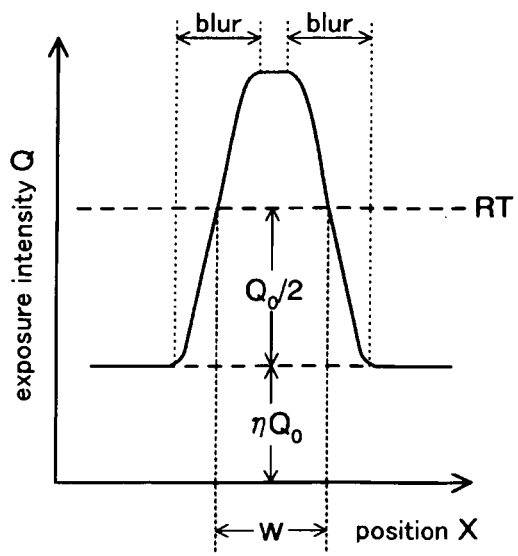
FIG. 8 is a graph showing an example of an exposure intensity distribution of a reference pattern.

FIG. 8 shows an exposure intensity distribution in a reference pattern. Here, the reference pattern is a pattern large enough to prevent interference between blurs of left, right, top and bottom edges of the electron beam, and to have a flat portion in the center. In the reference pattern, $\epsilon = \frac{1}{2}$ and $\alpha = 1$. In the reference pattern, if exposure intensity (reference exposure intensity) to have the same size as the designed value is $Q_0$, the reference exposure intensity $Q_0$ and the minimum resolution exposure intensity RT of the resist satisfy the relationship of $RT = Q_0/2 + \eta Q_0$.

Therefore, the exposure intensity $Q_A$ required for the exposure target pattern is obtained by the following equation based on the reference exposure intensity $Q_0$.

[Equation 3]

$$RT = Q_0/2 + \eta Q_0 = \epsilon Q_A + \alpha\eta Q_A \quad (3)$$

Then, the proximity effect correction coefficient P of each shot is obtained by dividing the exposure intensity $Q_A$ of the exposure target pattern by the reference exposure intensity $Q_0$ as shown in the following equation.

[Equation 4]

$$P = Q_A/Q_0 \quad (4)$$

The proximity effect correction coefficient P is determined by the parameters $\epsilon$, $\alpha$ reflecting the shape of the pattern itself, the surrounding pattern density and the like, as well as the reference exposure intensity $Q_0$ reflecting the resist material, and the like. Therefore, the proximity effect correction coefficient P is independent of the conditions specific to the electron beam exposure apparatus. Thus, the whole exposure data 80 including the exposure position, the electron beam size and the proximity effect correction coefficient P can be shared among different electron beam exposure apparatuses. In this way, sharing the whole exposure data 80 among different electron beam exposure apparatuses 1 eliminates the need to perform the proximity effect correction calculation in the individual electron beam exposure apparatuses 1, thus making it possible to reduce the time required to create the exposure data, and facilitating the management of the exposure data.

Next, in Step S20 in FIG. 5, the exposure data dividing unit 27 in the integrated control system 26 divides the whole exposure data 80. Here, the exposure data dividing unit 27 allocates each shot of the whole exposure data 80 to each column cell 11 based on the exposure position coordinates of the whole exposure data 80 (see FIG. 6). Then, the exposure data dividing unit 27 converts the exposure position coordinates into a coordinate system of each column cell 11. Thus, the dividing of the whole exposure data 80 is completed.

Next, the processing moves to Step S30 where the exposure time calculating unit 28 calculates an exposure time $T_1$ of the reference column cell based on the reference exposure time $T_0$ stored in the reference exposure time storage unit 29 and the proximity effect correction coefficient P included in the divided exposure data.

Note that the reference exposure time $T_0$ is the value obtained by dividing the reference exposure intensity $Q_0$ by the previously measured current density d of the electron beam EB of the reference column cell. As for the reference exposure time $T_0$, the exposure time required to form the reference pattern as designed in the reference column cell is given.

The exposure time calculating unit 28 obtains the exposure time $T_1$ of the reference column cell in consideration of the proximity effect by multiplying the reference exposure time $T_0$ described above by the proximity effect correction coefficient P.

Next, the processing moves to Step S40 where the exposure time calculating unit 28 in the integrated control system 26 calculates the exposure time $T_n$ of each column cell 11 other than the reference column cell, based on the correction parameters in the correction parameter storage unit 30, the reference exposure time $T_0$ in the reference exposure time storage unit 29, and the proximity effect correction coefficient P. Note that n represents the number of each column cell.

Here, the exposure time calculating unit 28 obtains the exposure time $T_n$ of the n-th column cell by adding a second correction parameter $B_n$ to a value obtained by multiplying the reference exposure time $T_0$ by a first correction parameter $A_n$.

[Equation 5]

$$T_n = A_n \times T_0 + B_n \quad (5)$$

Here, the correction parameters $A_n$ and $B_n$ are correction parameters for allowing a relationship $Q_n$ (w) between the exposure intensity and the line width for the n-th column cell to coincide with a relationship Q (w) between the exposure intensity and the line width for the reference column cell. The first correction parameter $A_n$ corrects the slope of the relationship $Q_n$ (w) between the exposure intensity and the line width for the n-th column cell, while the second correction parameter $B_n$ corrects an intercept of the relationship $Q_n$ (w) between the exposure intensity and the line width for the n-th column cell.

Figure 9:
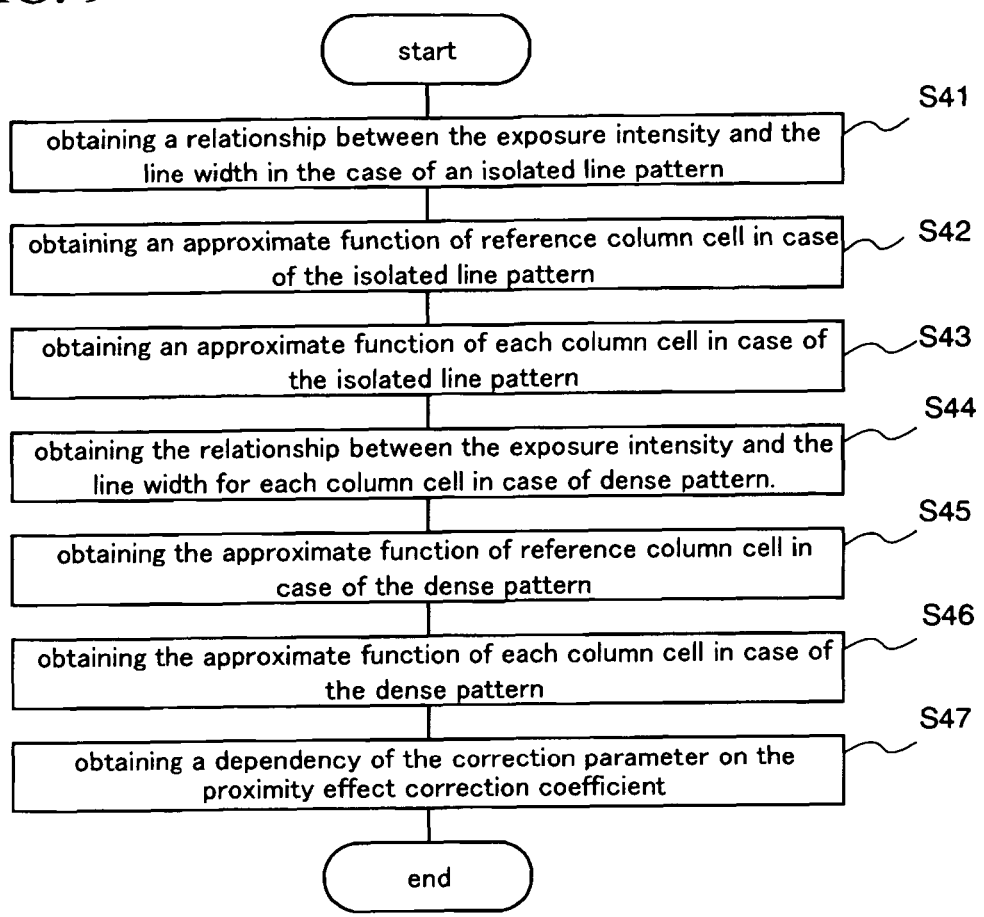
FIG. 9 is a flowchart showing a method for obtaining adjustment parameters.

FIG. 9 is a flowchart showing a method for obtaining the first correction parameter A and the second correction parameter B.

First, in Step S41 in FIG. 9, a relationship between the exposure intensity and the line width in the case of exposure of an isolated line pattern is obtained for each column cell 11.

Figure 10:
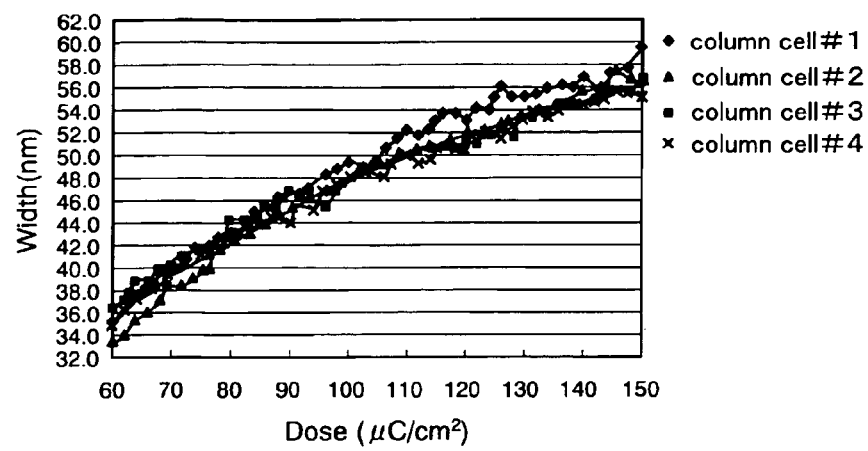
FIG. 10 is a graph showing an example of a result of measurement of a relationship between a line width of each column cell and a dose.

FIG. 10 is a graph showing an example of a relationship between the exposure intensity and the line width for each column cell 11 in the case of exposure of an isolated line pattern having a line width designed as 80 nm.

As shown in FIG. 10, the relationship between the exposure intensity Q (dose) and the line width w (width) varies in intercept and slope among the column cells 11. Thus, the uniform line width cannot be set for the overall range of exposure intensity by using only one of the intercept and slope to correct the relationship between the exposure intensity and the line width among the column cells 11. In order to allow the relationship between the exposure intensity and the line width for another column cell 11 to coincide with the relationship between the exposure intensity and the line width for the reference column cell, two correction parameters to correct the intercept and the slope are required.

Next, in Step S42, an approximate function $Q_{li}$ (w) is obtained by fitting the relationship between the exposure intensity Q and the line width w for the reference column cell using the following equation.

[Equation 6]

$$Q_u(w) = 2 \times RT \bigg/ \left\{ \mathrm{erf}\left(\frac{x+w}{2 \times \mathrm{blur}}\right) - \mathrm{erf}\left(\frac{x+w}{2 \times \mathrm{blur}}\right) - 2BS \right\} \quad (6)$$

Here, erf is an error function, RT is the minimum resolution exposure intensity ($\mu C/cm^2$) of the resist, and D ($A/cm^2$) is energy density of the electron beam. Moreover, w (nm) is a beam width, blur (nm) is a blur amount of the beam, and BS is a backscattering contribution.

The approximate function $Q_{li}$ (w) of the reference column cell is obtained by setting BS, Blur and RT in the equation (6) so that $Q_{li}$ (w) coincides with the result of measurement of the exposure intensity Q and the line width w of the reference column cell. Note that, in the case of FIG. 10, BS is 0.097, RT is 42.32 ($\mu C/cm^2$), and blur is 14.61 (nm).

Next, in Step S43, a first correction parameter $A_{ni}$ and a second correction parameter $B_{ni}$ for the n-th column cell, which satisfy the following equation, are obtained using a least-squares method, based on the relationship $Q_{ni}$ (w) between the exposure intensity Q and the line width w for the n-th column cell and the function $Q_{li}$ (w) of the reference column cell.

[Equation 7]

$$Q_{li}(w) = A_{ni} \times Q_{ni}(w) + B_{ni} \quad (7)$$

Here, the first correction parameters $A_{ni}$ and the second correction parameters $B_{ni}$ are obtained for every column cell but the reference column cell.

Figure 11:
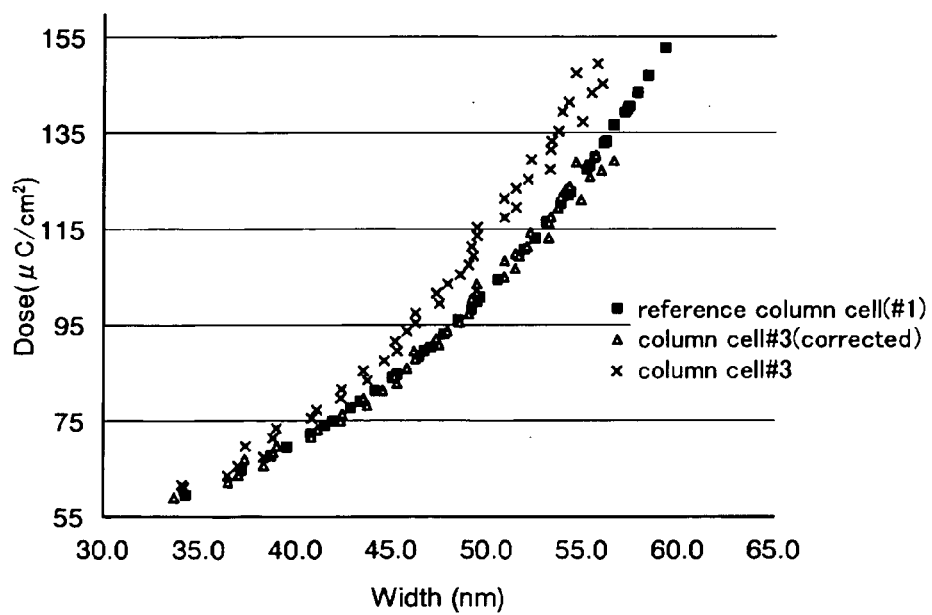
FIG. 11 is a graph showing relationships between doses and line widths of a reference column cell and an adjustment target column cell in an isolated pattern.

FIG. 11 is a graph showing an example where a relationship between exposure intensity and a line width for another column cell coincides with the relationship between the exposure intensity and the line width for the reference column cell in the isolated pattern. In the case of FIG. 11, the relationships between the exposure intensity and the line width coincide with each other by setting the first correction parameter $A_{3i}$ to 0.797 and the second correction parameter $B_{3i}$ to 11.62 ($\mu C$).

Meanwhile, the relationship between the exposure intensity and the line width for each column cell 11 varies with the pattern density (the proximity effect correction coefficient P). Accordingly, a first correction coefficient $A_{ni}$ and a second correction coefficient $B_{ni}$ vary with the proximity effect correction coefficient P.

Therefore, correction parameters $A_{nd}$ and $B_{nd}$ are also obtained for a dense pattern as shown in Steps S44 to S47 described below in the embodiment. Then, dependency of the correction parameters $A_n$ and $B_n$ on the proximity effect correction coefficient P is obtained by linear interpolation.

More specifically, in Step S44, the relationship between the exposure intensity and the line width for each column cell 11 in the case of exposure of the dense pattern is obtained. Note that, in the embodiment, a line-and-space pattern having a 1:1 width ratio between a line pattern and a space is used as the dense pattern. 50% is enough for the pattern density of the dense pattern. The pattern having the pattern density of 50% or more can be exposed as a pattern having the pattern density of virtually 50% or less by inverting the negative-positive relationship.

Next, in Step S45, an approximate function $Q_{ld}$ (w) is obtained by fitting the relationship between the exposure intensity and the line width for the reference column cell in the dense pattern, using the equation (6).

Thereafter, in Step S46, a first correction parameter $A_{nd}$ and a second correction parameter $B_{nd}$ for allowing the relationship $Q_{nd}$ (w) between the exposure intensity Q and the line width w for the n-th column cell to coincide with the function $Q_{ld}$ (w) of the reference column cell are obtained using a least-squares method.

Figure 12:
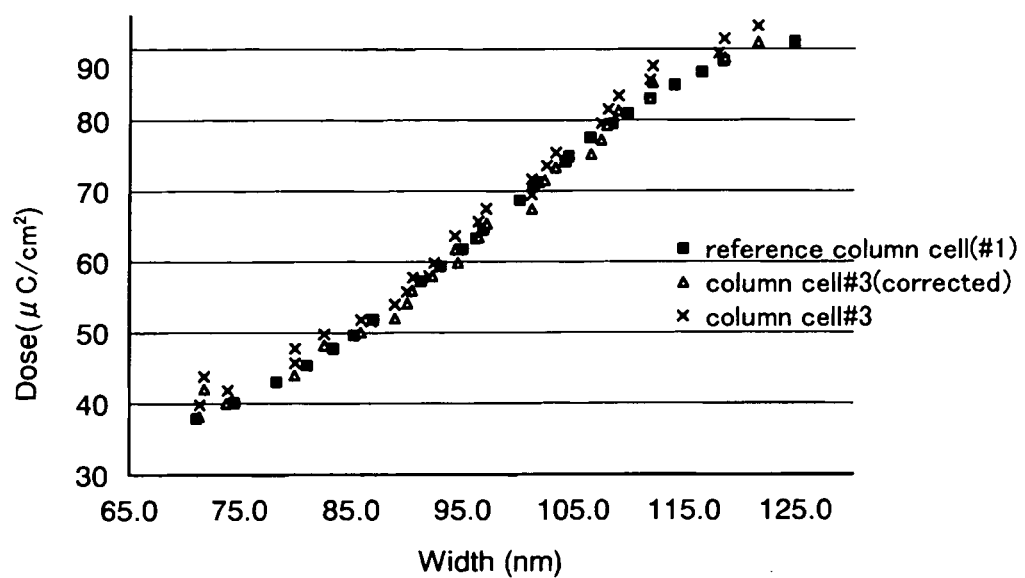
FIG. 12 is a graph showing relationships between doses and line widths of a reference column cell and an adjustment target column cell in a dense pattern.

FIG. 12 is a graph showing an example where the relationship between the exposure intensity and the line width for another column cell coincides with the relationship between the exposure intensity and the line width for the reference column cell in a line-and-space pattern having a line pattern width of 80 nm and a space width of 80 nm. In the case of FIG. 12, the relationships between the exposure intensity and the line width coincide with each other by setting the first correction parameter $A_{3d}$ to 0.985 and the second correction parameter $B_{3d}$ to −1.126.

Next, in Step S47, dependency of the first and second correction parameters $A_n$ and $B_n$ on the proximity effect correction coefficient P is obtained by linearly complementing the correction parameters A and B of the isolated pattern and dense pattern.

Here, assuming that proximity effect correction coefficients of the isolated pattern and dense pattern are $P_i$ and $P_d$, respectively, the first correction parameter $A_n$ (P) of the n-th column cell is obtained by the following equation.

[Equation 8]

$$A_n(P) = \frac{\{A_{ni} \times (P - P_d) + A_{nd} \times (P_i - P)\}}{(P_i - P_d)} \quad (8)$$

Moreover, the second correction parameter $B_n$ (P) is obtained by the following equation.

[Equation 9]

$$B_n(P) = \frac{\{B_{ni} \times (P - P_d) + B_{nd}(P_i - P)\}}{(P_i - P_d)} \quad (9)$$

Thus, the first correction parameter $A_n$ (P) and the second correction parameter $B_n$ (P) are obtained for the function of the proximity effect correction coefficient P.

The correction parameter storage unit 30 (see FIG. 4) in the integrated control system 26 stores the first correction parameter $A_n$ (P) and the second correction parameter $B_n$ (P) for each column cell 11 as the equations (8) and (9) described above.

Then, the exposure time calculating unit 28 determines the values of the first correction parameter $A_n$ and the second correction parameter $B_n$ by substituting the proximity effect correction coefficient P of the exposure target pattern into the equations (8) and (9).

Thus, the first correction parameter A and the second correction parameter B of each column cell 11 are obtained. Then, the exposure time calculating unit 28 calculates the exposure time $T_n$ of each column cell 11 using the equation (5), and thus the exposure data 81 of each column cell 11 is completed.

In the electron beam exposure apparatus 1 according to the embodiment, the exposure data 81 of each column cell 11 generated by the integrated control system 26 is stored in the buffer memory 23. Then, the column cell control unit 31 in each column cell 11 sequentially reads exposure conditions for each shot included in the exposure data 81 from the buffer memory 23, thus performing exposure in each column cell 11.

As described above, in the embodiment, exposure time of a correction target column cell is obtained by correcting the exposure time of the reference column cell based on the correction parameters for allowing a relationship between exposure intensity and line width for the correction target column cell to coincide with the relationship between the exposure intensity and the line width for the reference column cell.

Thus, the line widths of the reference column cell and correction target column cell can coincide with each other for the overall range of exposure intensity.

Moreover, the correction parameters A and B used to correct the exposure time among the column cells are determined based on five parameters including the proximity effect correction coefficient P and the correction parameters $A_i$, $B_i$, $A_d$ and $B_d$, which are obtained from the relationship between the exposure intensity and the line width for each of the isolated pattern and the dense pattern. Thus, a sufficient degree of freedom is achieved for correction of four error causes, such as (1) difference in aberration between columns, (2) difference in aperture size of the exposure mask, (3) difference in effective current density between columns, and (4) difference in line width due to backscattering of the electron beam attributable to the pattern shape (density).

Furthermore, the exposure time of each column cell 11 can be easily obtained as a linear function of the reference exposure time $T_0$ of the reference column cell. Thus, the exposure data 81 for each column cell 11 can be generated more quickly than the case where the proximity effect correction coefficient P specific to each column cell 11 is obtained for each column cell. Moreover, since there is no need to store the exposure data specific to each column cell 11, management of the exposure data is also facilitated.

Other Embodiments

While the description was given of the method for correcting the line width among the column cells 11 when proximity effect correction is performed using the exposure time in the embodiment described above, the correction method of the embodiment is also applicable to the case where the proximity effect correction is performed using auxiliary exposure.

A method for correcting the line width among the column cells 11 in the case of performing auxiliary exposure is described below.

First, in each of the column cells 11, a predetermined pattern is formed by performing exposure and auxiliary exposure, and then a relationship between auxiliary exposure time and the line width is obtained. Next, correction parameters are obtained, which allow a relationship between auxiliary exposure time and a line width for a correction target column cell to coincide with a relationship between auxiliary exposure time and a line width for a reference column cell.

Here, as the correction parameters, a third correction parameter for correcting the slope of the relationship between the auxiliary exposure time and the line width for the correction target column cell, and a fourth correction parameter for correcting the intercept are obtained.

The third and fourth correction parameters thus obtained are stored in the correction parameter storage unit 30 in the integrated control system 26 shown in FIG. 4.

Then, the exposure time calculating unit 28 in the integrated control system 26 obtains the auxiliary exposure time of the correction target column cell by adding the fourth correction parameter to a value obtained by multiplying the auxiliary exposure time of the reference column cell by the third correction parameter.

By performing the auxiliary exposure in each of the column cells 11 based on the auxiliary exposure time thus obtained, a variation in line width among the column cells 11 can be corrected also when the proximity effect correction is performed using the auxiliary exposure.

What is claimed is:

1. An electron beam exposure apparatus comprising:
a plurality of column cells arranged above a sample and configured to irradiate electron beams in parallel onto a surface of the sample;
an integrated controller configured to generate exposure data including an exposure position, an exposure pattern and an exposure time of each shot of the plurality of column cells;
a column cell control unit provided in each of the column cells and configured to control the column cell based on the exposure data;
a correction parameter storage unit provided in the integrated controller and configured to store a correction parameter for allowing a relationship between exposure intensity and a line width for a correction target column cell to coincide with a relationship between exposure intensity and a line width for a reference column cell selected from among the plurality of column cells;

a reference exposure time storage unit provided in the integrated controller and configured to store reference exposure time required to form a predetermined reference pattern having a line width as designed in the reference column cell; and an exposure time calculating unit provided in the integrated controller and configured to obtain exposure time of the correction target column cell by correcting the reference exposure time based on the correction parameter.

2. The electron beam exposure apparatus according to claim 1, wherein the correction parameter includes a first correction parameter for correcting a slope of the relationship between the exposure intensity and the line width for the correction target column cell, and a second correction parameter for correcting the intercept of the relationship between the exposure intensity and the line width for the correction target column cell.

3. The electron beam exposure apparatus according to claim 2, wherein the exposure time calculating unit obtains the exposure time of the correction target column cell by adding the second correction parameter to a value obtained by multiplying the reference exposure time by the first correction parameter.

4. The electron beam exposure apparatus according to any one of claims 1 to 3, wherein the reference pattern is a pattern in which a distance between edges opposite to each other is larger than a range of blurs caused by scattering the corresponding electron beam.

5. The electron beam exposure apparatus according to claim 4, wherein the exposure time calculating unit obtains exposure time required to expose an exposure target pattern in the reference column cell by multiplying a proximity effect correction coefficient by the reference exposure time, the proximity effect correction coefficient representing the ratio between exposure intensity required to obtain a line width as designed in the exposure target pattern and exposure intensity required to obtain a line width as designed in the reference pattern.

6. The electron beam exposure apparatus according to claim 5, wherein the first and second correction parameters are expressed by functions of the proximity effect correction coefficient, and values of the first and second correction parameters are determined based on the proximity effect correction coefficient of the exposure target pattern.

7. The electron beam exposure apparatus according to claim 1, wherein the correction parameter storage unit stores an auxiliary exposure intensity correction parameter for allowing a relationship between auxiliary exposure intensity and the line width for the correction target column cell to coincide with a relationship between auxiliary exposure intensity and the line width for the reference column cell, and the exposure time calculating unit obtains auxiliary exposure time of the correction target column cell by correcting auxiliary exposure time of the reference column cell based on the auxiliary exposure intensity correction parameter.

8. An electron beam exposure method for exposing a plurality of patterns in parallel on a wafer by use of a plurality of column cells configured to irradiate electron beams, the method comprising the steps of:

obtaining a relationship between exposure intensity and a line width for each of the column cells by exposing a predetermined pattern in the column cell while changing exposure time, and measuring the line width of the pattern;

obtaining a correction parameter for allowing a relationship between exposure intensity and a line width for a correction target column cell to coincide with a relationship between a line width and exposure intensity for a reference column cell selected from among the plurality of column cells;

obtaining reference exposure time required to form a predetermined reference pattern having a line width as designed in the reference column cell;

calculating exposure time of the correction target column cell based on the correction parameter and the reference exposure time; and performing exposure in the correction target column cell based on the exposure time of the correction target column cell.

9. The electron beam exposure method according to claim 8, wherein the correction parameter includes a first correction parameter for correcting a slope of the relationship between the exposure intensity and the line width for the correction target column cell, and a second correction parameter for correcting the intercept of the relationship between the exposure intensity and the line width for the correction target column cell.

10. The electron beam exposure method according to claim 9, wherein the exposure time of the correction target column cell is obtained by adding the second correction parameter to a value obtained by multiplying the reference exposure time by the first correction parameter.

11. The electron beam exposure method according to any one of claims 8 to 10, wherein the reference pattern is a pattern in which a distance between edges opposite to each other is larger than a range of blurs caused by scattering of the corresponding electron beam.

12. The electron beam exposure method according to claim 11, wherein exposure time required to expose an exposure target pattern in the reference column cell is obtained by multiplying a proximity effect correction coefficient by the reference exposure time, the proximity effect correction coefficient representing the ratio between exposure intensity required to obtain a line width as designed in the exposure target pattern and exposure intensity required to obtain a line width as designed in the reference pattern.

13. The electron beam exposure method according to claim 12, further comprising the steps of:

obtaining the first and second correction parameters for each of an isolated pattern and a dense pattern, and obtaining dependency of the first and second correction parameters on the proximity effect correction coefficient by linear interpolation; and determining values of the first and second correction parameters based on a proximity effect correction coefficient of the exposure target pattern.

14. An electron beam exposure method for exposing a plurality of patterns in parallel on a wafer by use of a plurality of column cells configured to irradiate electron beams, and then performing auxiliary exposure to correct the influence of a proximity effect during the exposure, the method comprising the steps of:

- obtaining a relationship between auxiliary exposure intensity and a line width for each of the column cells by performing auxiliary exposure on a pattern exposed in the column cell while changing auxiliary exposure time, and measuring a line width of the pattern;
- obtaining a correction parameter for allowing a relationship between auxiliary exposure intensity and a line width for a correction target column cell to coincide with a relationship between auxiliary exposure intensity and a line width for a reference column cell selected from among the plurality of column cells;
- calculating auxiliary exposure time of the correction target column cell by correcting auxiliary exposure time of the reference column cell based on the correction parameter; and
- performing auxiliary exposure in the correction target column cell based on the auxiliary exposure time of the correction target column cell.

* * * * *